United States Patent
Cho et al.

(10) Patent No.: US 6,877,912 B2
(45) Date of Patent: Apr. 12, 2005

(54) ELECTRO-OPTICAL CIRCUIT BOARD HAVING OPTICAL TRANSMIT/RECEIVE MODULE AND OPTICAL WAVEGUIDE

(75) Inventors: In Kui Cho, Daejon-Shi (KR); Keun Byoung Yoon, Daejon-Shi (KR); Sang Pil Han, Daejon-Shi (KR); Seung Ho Ahn, Daejon-Shi (KR); Myung Yung Jeong, Daejon-Shi (KR)

(73) Assignee: Electronics and Telecommunication Research Institute, Daejon (KR)

( * ) Notice: Subject to any disclaimer, the term of this patent is extended or adjusted under 35 U.S.C. 154(b) by 208 days.

(21) Appl. No.: 10/285,635

(22) Filed: Nov. 1, 2002

(65) Prior Publication Data

US 2004/0037512 A1 Feb. 26, 2004

(30) Foreign Application Priority Data

Aug. 21, 2002 (KR) ........................................ 2002-49380

(51) Int. Cl.[7] .............................. G02B 6/42; G02B 6/12
(52) U.S. Cl. .......................................... 385/88; 385/14
(58) Field of Search ................................ 385/14, 88–94

(56) References Cited

U.S. PATENT DOCUMENTS 5,198,684 A * 3/1993 Sudo ........................... 257/79
6,152,610 A    11/2000 Hattori
6,257,771 B1 * 7/2001 Okayasu ....................... 385/89
6,324,328 B1   11/2001 Mehlhorn et al.
6,477,286 B1 * 11/2002 Ouchi .......................... 385/14

FOREIGN PATENT DOCUMENTS

KR       2002-12945    2/2002   ........... H01L/31/12

OTHER PUBLICATIONS

Yuzo Ishii, et al; *SMT–Compatible Optical–I/O Chip Packaging for Chip–Level Optical Interconnects*; 2001 Electronic Components and Technology Conference; 2001 IEEE.

* cited by examiner

*Primary Examiner*—Rodney Bovernick
*Assistant Examiner*—Sarah Song
(74) *Attorney, Agent, or Firm*—Mayer, Brown, Rowe & Maw LLP (57) ABSTRACT

An electro-optical circuit board (EOCB) in which an optical waveguide for transmitting an optical signal, and a driving unit/receiving unit and an optical source/optical detector for converting an electrical signal into the optical signal, and vice versa are integrated. The EOCB has a structure from which a lens is excluded for the purpose of an economical and efficient optical coupling between the optical waveguide and the optical source/optical detector. The optical source/optical detector are buried within a trench of a metal optical bench. The optical waveguide is then attached on the surface of the optical source/optical detector by means of an epoxy.

12 Claims, 10 Drawing Sheets

ELECTRO-OPTICAL CIRCUIT BOARD HAVING OPTICAL TRANSMIT/RECEIVE MODULE AND OPTICAL WAVEGUIDE

BACKGROUND OF THE INVENTION

1. Field of the Invention

The invention relates generally to an electro-optical circuit board (EOCB). More particularly, the invention relates to an electro-optical circuit board (EOCB) having an optical transmit/receive module and an optical waveguide integrated, in which the optical transmit/receive module where the optical waveguide for transmitting an optical signal, a driving unit/receiving unit for converting an electrical signal into the optical signal, and vice versa, and an optical source/optical detector are integrated is manufactured, and the integrated optical transmit/receive module is attached within a trench formed in a printed circuit board, thus minimizing an alignment error between the optical source/optical detector and the optical waveguide and facilitating its manufacture.

2. Description of the Prior Art

As a technology of an integrated circuit (IC) is progressively advanced and the operating speed and the level of integration are thus improved, a higher performance of a microprocessor and a larger capacity of a memory chip are rapidly progressed. Accordingly, a next-generation information communication system having a large capacity parallel computer, an asynchronous transfer mode (ATM) switching system of over a terabit (Tb/s) level capable of transmitting information of a large capacity, or the like, requires a further improved signal processing capability. Due to this, there is a need for higher speed of a signal transfer and a higher density of a line.

In a conventional device, however, as information is usually transferred by means of an electrical signal between a relatively short distance such as between the board and the board or between the chip and the chip, there is a limitation in accomplishing a higher speed of the signal transfer and a higher density of the line. In addition, there is a significant problem that the signal is delayed due to the resistance of the line itself. Further, as the higher speed of the signal transfer and the higher density of the line may generate a noise due to electromagnetic interference (EMI), there is a need for a solution to solve these problems.

Recently, an optical line has been spotlighted as a solution for solving these problems. The optical line can be applied to various sections such as between the device and the device, the board and the board, or the chip and the chip. In particular, it is considered that the optical line is suited for an optical transfer communication system for the signal transfer in a relatively short distance such as between the chip and the chip.

Most of the patents relating to the conventional electro-optical circuit board (EOCB) include a silicon chip for transmittance based on a silicon substrate, an optical emitting unit, an optical board unit, an optical detector, a silicon chip for reception, or the like. Also, they include a lens for an optical coupling. This construction, however, is a modified type of the conventional optical transmit/receive module. It is thus consider that this type of the electro-optical circuit board (EOCB) is difficult to be used as the EOCB of a real sense that can be applied to the common PCB in order to solve the electrical interconnection problem.

A typical type of the conventional EOCB includes U.S. Pat. No. 6,324,328 entitled "Circuit Carrier with Integrated, Active, Optical Functions". This patent uses an optical waveguide stacked within the PCB, as the optical line for transmitting the signal. However, this patent does not clearly disclose a solution for solving a problem relating to an alignment of the optical waveguide. It is thus considered that this patent is difficult to be implemented.

Another example includes a prototype utilizing an existing SMT system manufactured by NTT, Inc. (Japan). The prototype has a structure in which the VCSEL and a photo diode are sealed into a hole at the rear of a plastic BGA package and two polymer micro lenses are positioned on a single optical trace in order to magnify a mounting tolerance error. Further, this patent discloses that optical signals are transmitted in parallel between the IC packages and a mounting cost is significantly reduced.

However, this technology is difficult to be used due to three alignment errors: an error occurring when the optical waveguide is stacked within the PCB, an error occurring when the VCSEL is attached to the rear of the plastic BGA, and an error occurring due to a secondary interconnection when the plastic BGA is soldered to the PCB. Further, as this prototype has a structure in which the VCSEL is completed closed, there is a disadvantage that a heat generated from the chip is not dispersed or cooled.

SUMMARY OF THE INVENTION

The present invention is contrived to solve the above problems and an object of the present invention is to provide an electro-optical circuit board having an optical transmit/receive module and an optical waveguide integrated, in which the optical transmit/receive module where the optical waveguide for transmitting an optical signal, a driving unit/receiving unit for converting an electrical signal into the optical signal, and vice versa, and an optical source/optical detector are integrated is manufactured, and the optical transmit/receive module and the circuit board are combined to form a daughter board so that the driving unit/receiving unit and the optical source/optical detector are inserted into a trench formed in the circuit board.

In order to accomplish the above object, an electro-optical circuit board according to the present invention, is characterized in that it comprises a plurality of daughter boards having electrical circuits, on which an optical transmit/receive module and a plurality of electrical circuit chips, both of which are integrated, are mounted; and a motherboard having electrical circuits and connected to the plurality of the daughter boards, wherein an electrical signal outputted from the electrical circuit chip of one of the plurality of the daughter boards is converted into an optical signal through the optical transmit module, transmitted to an optical waveguide of the motherboard through an optical waveguide of the daughter board and then transmitted to the optical receive module through an optical waveguide of the other daughter board.

Further, the optical transmit/receive module comprises a metal bench having a trench at its given portion; a high speed board attached below the metal bench except for the trench and having an electrical circuit connected to the daughter board; a driving unit/receiving unit for converting an electrical signal into an optical signal, and vice versa, the driving unit/receiving unit being attached within the trench and electrically connected to the high-speed board by means of a bond wire; an optical source/optical detector installed near the high speed board and electrically connected to the driving unit/receiving unit by means of a bond wire; and an optical waveguide attached below the metal bench so that the reflecting surface is mated with an aperture of the optical source/optical detector.

The driving unit/receiving unit is a vertical cavity surface emitting laser. The optical source/optical detector is a vertical cavity surface emitting layer (VCSEL) array or a photo diode array having the total transfer amount of Gbps of several dozens or several hundreds.

The electro-optical circuit board further comprises a heat spreader attached on the metal bench.

The most significant obstacle in marketing the electro-optical circuit board (EOCB) is that the production cost is too high compared to the common PCB. The high production cost mostly lies in complicated process steps for overcoming the alignment problem. For example, if a silicon optical bench (SIOB) for an exact alignment is used, it occupies at least 30% of the entire cost for manufacturing the electro-optical circuit board (EOCB).

In order to overcome this problem, the present invention employs an optical transmit/receive module in which a driving unit/receiving unit, an optical source/optical detector and an optical waveguide are integrated in a metal bench having a heat spreader instead of the conventional expensive silicon optical bench (SIOB). Therefore, the present invention can simultaneously solve the alignment problem and the product cost problem that are the most significant problems in commercializing the electro-optical circuit board (EOCB), by using the electro-optical circuit board (EOCB) of a new structure. Further, the present invention is focused to accomplish a competitive price by adopting a multichannel optical waveguide that can be easily mounted compared to the optical fiber, a cheap polymer material and a cheap hot embossing process.

For this, the present invention provides the electro-optical circuit board (EOCB) in which the optical transmit/receive module where the optical waveguide for transmitting the optical signal, the driving unit/receiving unit and the optical source/detector are integrated is mounted on a multi-layer printed circuit board (PCB).

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 1:
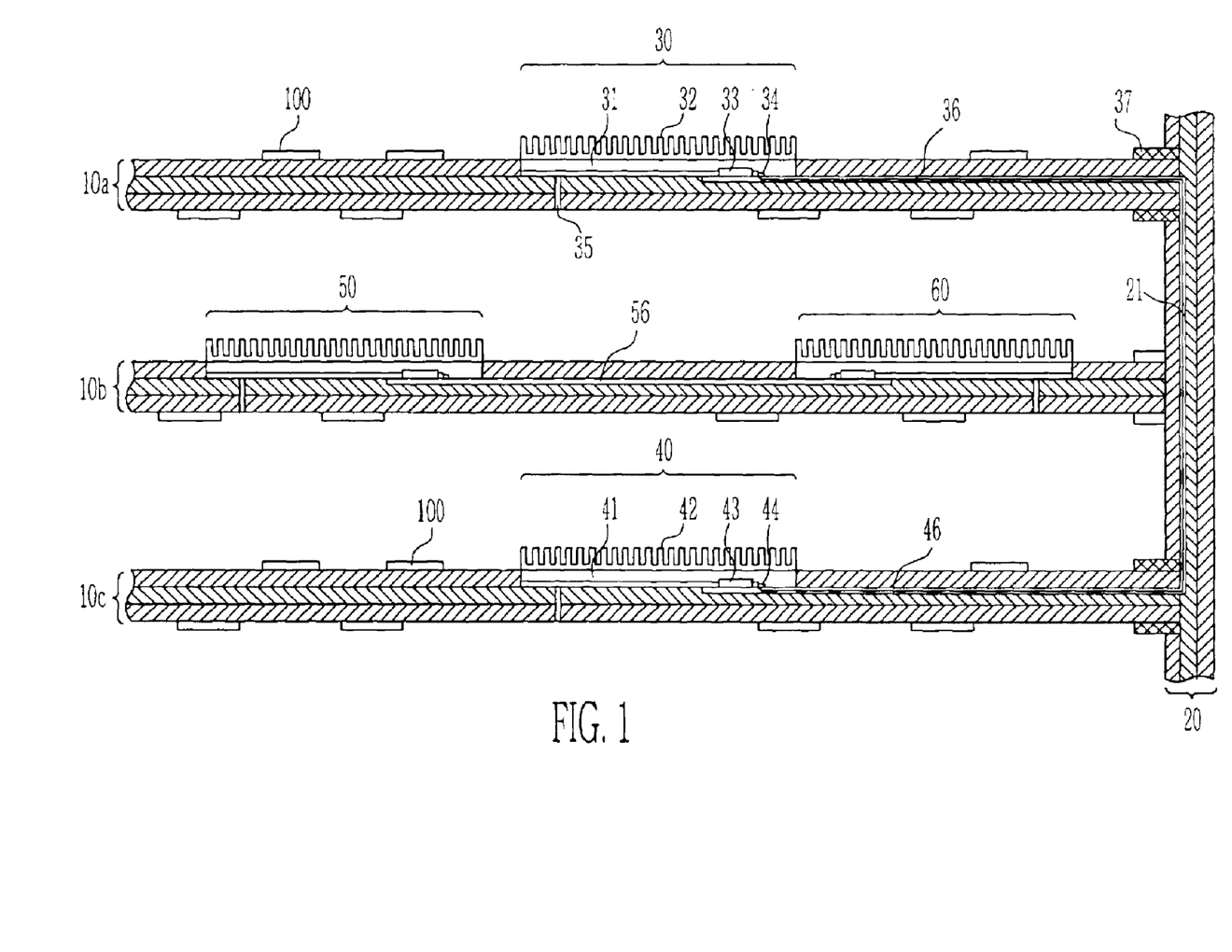
FIG. 1 is an entire structure of an electro-optical circuit board (EOCB) according to the present invention.

FIG. 1 is an entire structure of an electro-optical circuit board (EOCB) according to the present invention. The electro-optical circuit board (EOCB) comprises a motherboard 20 having an optical line and an electrical line, and a plurality of daughter boards 10a, 10b and 10c having an electrical circuit chip and an electrical/optical signal converter, as a main components.

Each of the daughter boards 10a, 10b and 10c is coupled, for example, vertically to the motherboard 20. An interposer 37 for guiding an exact insertion of the daughter boards 10a, 10b and 10c is included in the motherboard 20. Further, a coupling portion of the daughter boards 10a, 10b and 10c has a polished plane and a coupling portion of the motherboard 20 has a reflecting surface on which a metal having a slant surface of about 45° or a curved surface is coated, so that an optical coupling can be easily performed.

Figure 2A:
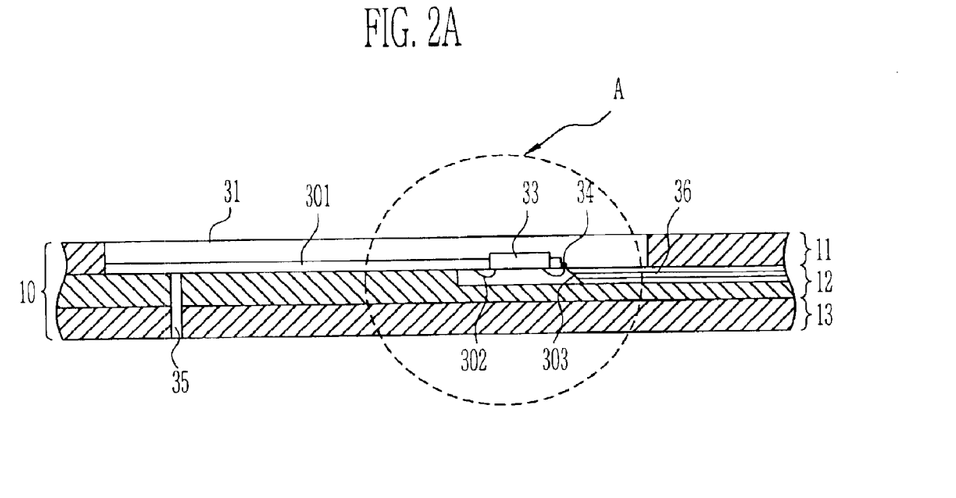
FIG. 2a~FIG. 2b show detailed drawings of the daughter board shown in FIG. 1.

Each of the daughter boards 10a, 10b and 10c includes a multi-layer structure, for example, upper, intermediate and lower printed circuit boards (PCBs) 11, 12 and 13 each having a thickness of about 1 mm, as shown in FIG. 2a. A plurality of chips 100 are attached to the upper and lower PCBs 11 and 13. Optical transmit/receive modules 30, 40, 50 and 60 are formed within a trench -formed in the upper and intermediate PCBs 11 and 12. The optical transmit/receive module 50 and the optical transmit/receive module 60 or the optical transmit/receive modules 30 and 40 and the optical waveguide 21 of the motherboard 2 are connected through the optical waveguide 56 formed in the intermediate PCB 12.

The optical waveguides 21, 36, 46 and 56 are mounted on a given region of the printed circuit board (PCB) constituting the motherboard 20 and the daughter boards 10a, 10b and 10c, in which a problem relating to an electrical connection is occurred upon a high-speed transfer of a signal. It is thus possible to prevent generation of a bottle phenomenon, skew, EMI, etc. when the signal is transmitted between the board and the board or the chip and the chip.

Figure 2B:
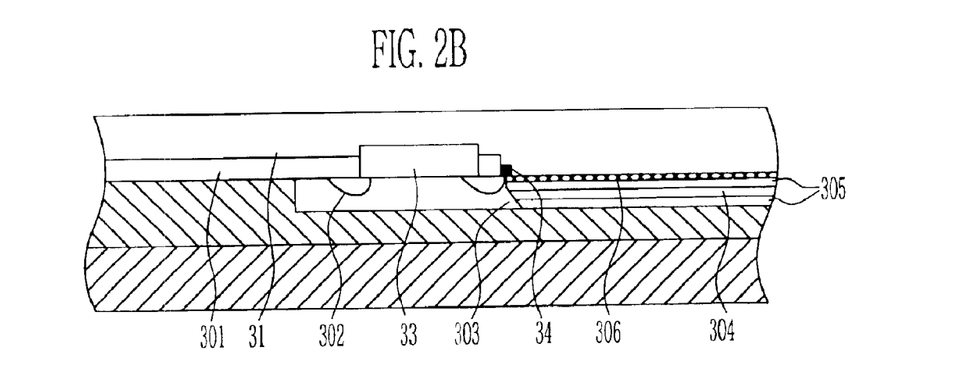

Each of the optical transmit/receive modules 30, 40, 50 and 60 is constructed, as shown in FIG. 2a and FIG. 2b. FIG. 2b is a detailed drawing of a portion A shown in FIG. 2a.

A trench is formed at a given portion of the metal bench 31. At this time, the metal bench 31 is made of a metal having a good thermal conductivity such as copper (Cu) or aluminum (Al) and has a thickness of about 1 mm. A high-speed board 301 in which electrical circuits are formed is attached below the metal bench 31 except for the trench. A vertical cavity surface emitting laser (VCSEL) driver 33 is inserted into the trench. A vertical cavity surface emitting layer (VCSEL) 34 used as a light source is installed at one side of the high-speed board 301 neighboring the VCSEL driver 33. The VCSEL driver 33 and the high-speed board 301, and the VCSEL driver 33 and the VCSEL 34 are electrically connected one another by means of a bond wire 302. An optical waveguide 36 is attached below the metal bench 31. At this time, the optical waveguide 36 is attached using an UV epoxy 306, so that degradation in an optical characteristic can be minimized in a course that light is transmitted from an aperture of the VCSEL 34 to the core 304, after the reflecting surface 303 formed at one end of the optical waveguide 36 having a core 304 and a clad 305 surrounding the core 304 is aligned in line with the aperture. Further, the high-speed board 301 is electrically connected to the lower PCB 13 through a via 35 through which the medium and lower PCBs 12 and 13 are penetrated.

As described above, the optical transmit/receive modules 30, 40, 50 and 60 include a vertical cavity surface emitting laser (VCSEL) array or a photo diode array having the total transfer amount of several dozens~several hundreds of Gbps as the optical source/optical detector 34 for providing a light source and detecting the optical signal in order to convert the electrical signal into the optical signal, and vice versa, which are generated in the electrical circuit chip 100. The optical transmit/receive modules 30, 40, 50 and 60 further includes a VCESL driver as the driving unit/receiving unit 33 for driving the VCSEL array or the photo diode. There inevitably accompanies a signal integrity problem in designing and interconnecting the electrical circuits. It is thus required that the optical transmit/receive modules 30, 40, 50 and 60 be designed and manufactured considering the above problem. As one example, designing a high-speed electrical circuit requires a trace structure of a micro strip or a strip line shape. The present invention has a structure of the strip line shape, to which the dimension of a chip pad is exactly matched when the dielectric constant is 3.1, the heights of the dielectric constant are 60 $\mu$m at the top and bottom, respectively, the line width is 75 $\mu$m and the distance between the lines is 50 $\mu$m. It is thus possible to implement a high-speed PCB having an impedance matching and a crosstalk characteristic of below −30 dB.

Further, it is require to manufacture the optical waveguides 21, 36, 46 and 56 so that light emitted from the optical source 34 is effectively coupled since the converted optical signal is transmitted through the optical waveguides 21, 36, 46 and 56.

The electro-optical circuit board (EOCB) of the present invention can be easily applied to the common PCB process. It is also important that the optical waveguide and the optical transmit/receive module are not deformed in the manufacture process.

A basic operation principle of the electro-optical circuit board (EOCB) according to the present invention will be described.

In order to transmit the electrical signal generated from the electrical circuit chip 100 of one daughter board 10a to the electrical circuit chip 100 of the other daughter board 10b, signals generated from the chip of the same group are multiplexed. The signals are then transmitted to the VCSEL driver 33 through a transmit line and the via 35. At this time, the transmitted signals are converted in the VCSEL driver 33 to drive the VCSEL 34.

The VCSEL 34 illuminates light at a given angle of radiation through the aperture. The illuminated light is coupled to the optical waveguide 36 having an optical coupling efficiency of over 80% and is then transmitted along the optical waveguide 36 having the insertion loss of 0.1~0.3 dB/cm.

The optical trace of the optical signal transmitted along the optical waveguide 36 in the daughter board 10a is shifted by 90° by means of the reflecting surface formed in the coupling portion of the motherboard 20. Next, the optical signal is transmitted through the optical waveguide 21 formed at the motherboard 20. With the same method, the optical signal is transmitted to the optical waveguide 46 of the other daughter board 10c. Finally, the light reached the end of the optical waveguide 46 is incident to the optical detector 44 including the photo diode (PD), for example, having the optical coupling efficiency of over 80%. The optical detector 44 converts the optical signal into the electrical signal and then sends the converted signal to the receiving unit 43. The receiving unit 43 demultiplexes the signal and then sends the demultiplexed signal to the electrical circuit chip 100.

The signal between the chips within the same board is transferred with the same method described above. For example, the optical signal transmitted from the optical transmit module 50 reaches the optical receive module 60 via the optical waveguide 56 within the same board.

A concept of the signal transfer will be described in detail by reference to FIG. 2a and FIG. 2b. The electrical signal is transmitted to the VCSEL driver 33 through the via 35 and an electrical circuit being an electrical trace of the high-speed board 301. The electrical trace of the high-speed board 301 and the VCSEL driver 33 are electrically connected by the bond wire 302 or connected by a flip chip bond. The VCSEL driver 33 and the VCSEL 34 are also electrically connected by the bond wire 302. At this time, the VCSEL driver 33 and the VCSEL 34 are located closely by maximum, for example within a distance of 1 mm so that distortion of a signal due to a parasitic effect of the electrical signal is minimized.

The VCSEL 34 emits light in a direction vertical to the surface of the aperture. It is thus required that the aperture of the VCSEL 34 and the core 304 of the optical waveguide 36 be kept within a distance of 200 $\mu$m so that the emitted light of over 80% is optically coupled through the reflecting surface 303 of the optical waveguide 36 plated with a metal. At this time, the dimension of a chip used is about 2100× 4300×540 $\mu$m in the VCSEL driver 33, and is about 230× 3000×200 $\mu$m in the VCSEL array 34. The total length of the optical waveguide 36 made by a hot-embossing process is about 5~10 cm, the length of the cross section of the core 304 is about 100×100 $\mu$m, and the length of the cross section of the clad 305 is about 100 $\mu$m.

FIG. 3a~FIG. 3f are cross-sectional views of the optical transmit/receive module, for describing a method of manufacturing the optical transmit/receive module according to the present invention.

Figure 3A:
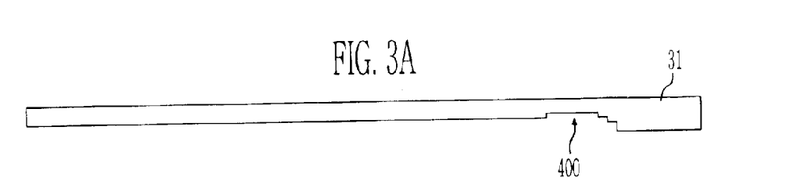
FIG. 3a~FIG. 3f are cross-sectional views of optical transmit/receive modules shown in FIG. 1, for describing a method of manufacturing the optical transmit/receive module according to the present invention.

Referring now to FIG. 3a, a given trench 400 is formed at a lower portion of the metal bench 31 consisting of a metal circuit plate such as copper (Cu).

Figure 3B:
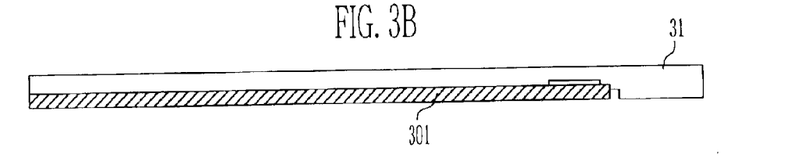

By reference to FIG. 3b, a ground surface of the high-speed board 301 for providing a transfer trace of the electrical signal is adhered to the bottom of the metal bench 31 by means of a metal adhesive.

Figure 3C:
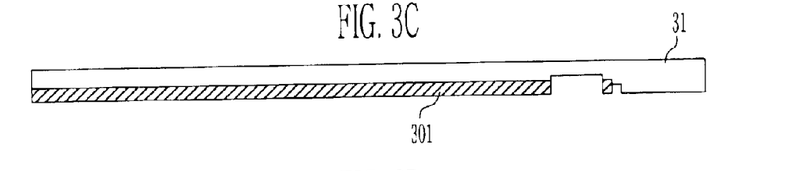

Referring to FIG. 3c, the high-speed board 301 is patterned so that the trench 400 is exposed.

Figure 3D:
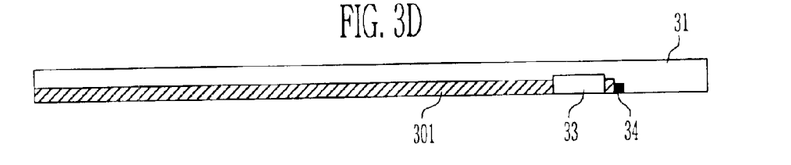

By reference to FIG. 3d, the VCSEL driver 33 and the VCSEL 34 are inserted into the trench 400 so that they neighbor each other and the ground surfaces of the VCSEL driver 33 and the VCSEL 34 are then adhered to the metal bench 31 by means of a metal adhesive. At this time, the VCSEL driver 33 is surrounded with the high-speed board 301 and the VCSEL 34 is also installed at one side of the high-speed board 301.

Figure 3E:
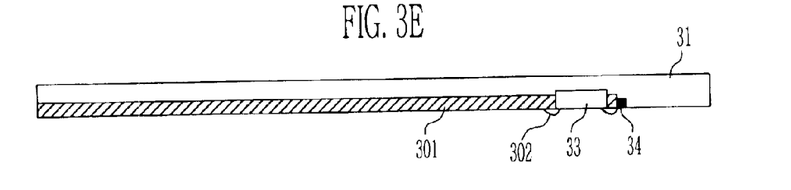

Referring now to FIG. 3e, the VCSEL driver 33 and the high-speed board 301, and the VCSEL driver 33 and the VCSEL 34 are connected by the bond wire 302 or a flip chip, respectively.

Figure 3F:
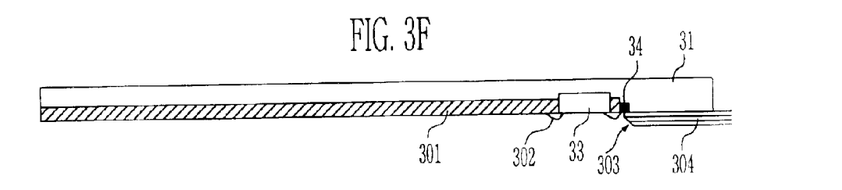

By reference to FIG. 3f, twelve optical waveguides 36 made of polymer is adhered to the bottom of the metal bench 31. At this time, the reflecting surface 303 formed at one end of the optical waveguide 36 is aligned to the aperture of the VCSEL 34. Further, the reflecting surface 303 is adhered using the UV epoxy 306 so that degradation in the optical characteristic can be minimized in a course that the light is transferred from the aperture to the core 304.

Figure 4:
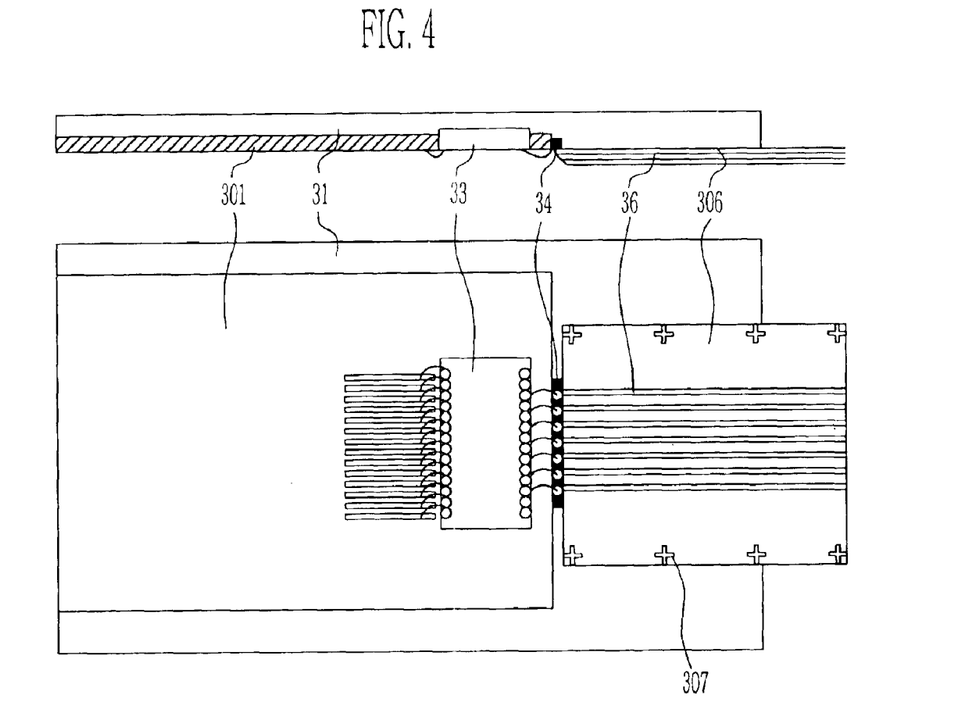
FIG. 4 is a plan view of the optical transmit/receive module according to the present invention.

FIG. 4 is a plan view of the optical transmit/receive module manufactured like that described in FIG. 3f. In order to match the aperture of the VCSEL 34 and the core 304 of the optical waveguide 36 upon alignment, a plurality of crosses 307 are formed in the optical waveguide 36 and the metal bench 31, respectively. At this time, it is required that the mounting tolerance error between the aperture and the core 304 be kept below ±40 μm for the purpose of an exact alignment.

Figure 5A:
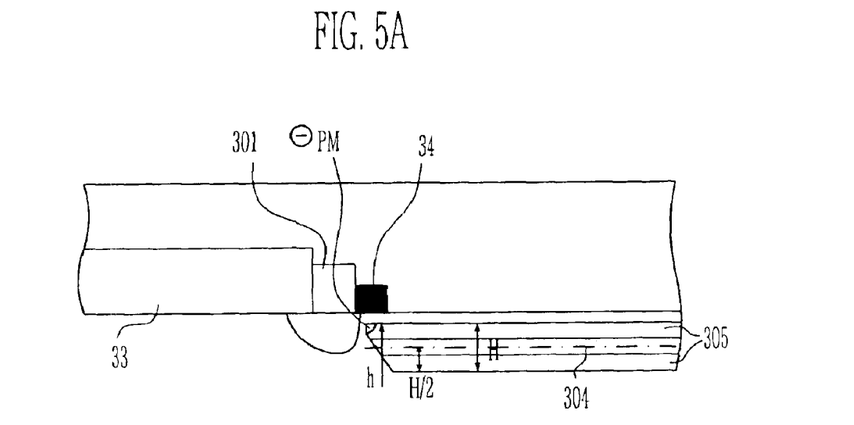
FIG. 5a is a detailed drawing of an optical bench according to the present invention.

FIG. 5a is a detailed drawing of the optical bench used in the present invention, which illustrates a result of an optical alignment simulation of the integrated optical transmit/receive module.

A tilt angle of the reflecting surface 303 in the optical waveguide 36 is 45° and the reflecting surface 303 is plated with gold. The simulation is performed in a ray tracing scheme under the condition that the thickness of the optical waveguide 36 is H μm, the difference in the optical waveguide is 1.2% and an angle of an optical radiation in the VCSEL 34 is 12°.

Figure 5B:
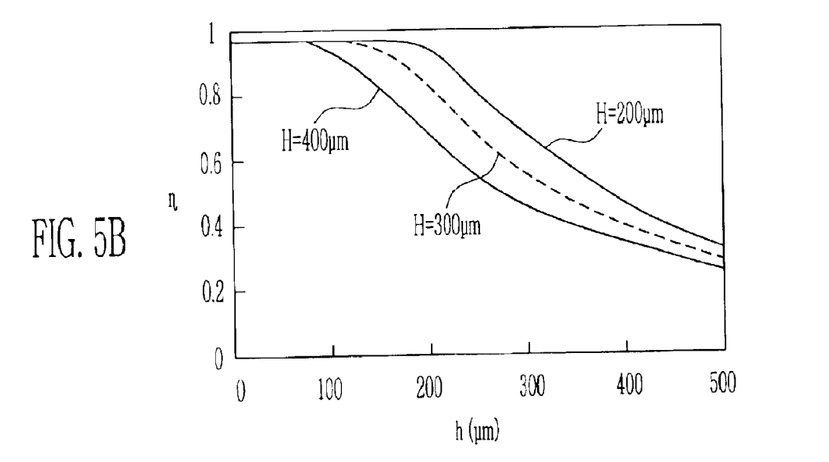
FIG. 5b~FIG. 5d are graphs illustrating a result of an optical alignment simulation using the optical transmit/receive module of the present invention.

FIG. 5b is a graph illustrating a simulation result of FIG. 5a. FIG. 5b illustrates an optical coupling characteristic depending on the dimension of the optical waveguide 36, that is, variation in the height H and the distance h between the aperture of the VCSEL 34 and the optical waveguide 36. At this time, the cores 304 have the same dimension, 100×100 μm². In case that the distance h between the aperture of the VCSEL 34 and the optical waveguide 36 is below, 100 μm, it was found that all of the cores 304 have an optical coupling of over 90%.

Figure 5C:
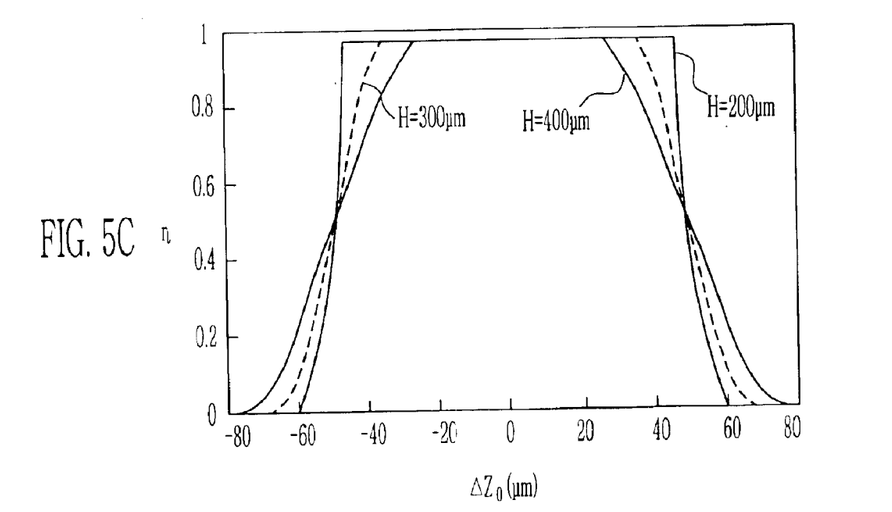

FIG. 5c is a graph illustrating a simulation result of FIG. 5a. FIG. 5c illustrates an alignment error of a Z axis depending on the dimension of the optical waveguide 36, that is, variation in the height H. At this time, the distance h between the aperture of the VCSEL 34 and the optical waveguide 36 is fixed below 100 μm. If the height H is 300 μm, a mounting tolerance error of the Z axis for the optical coupling of 80% is ±40 μm.

Figure 5D:
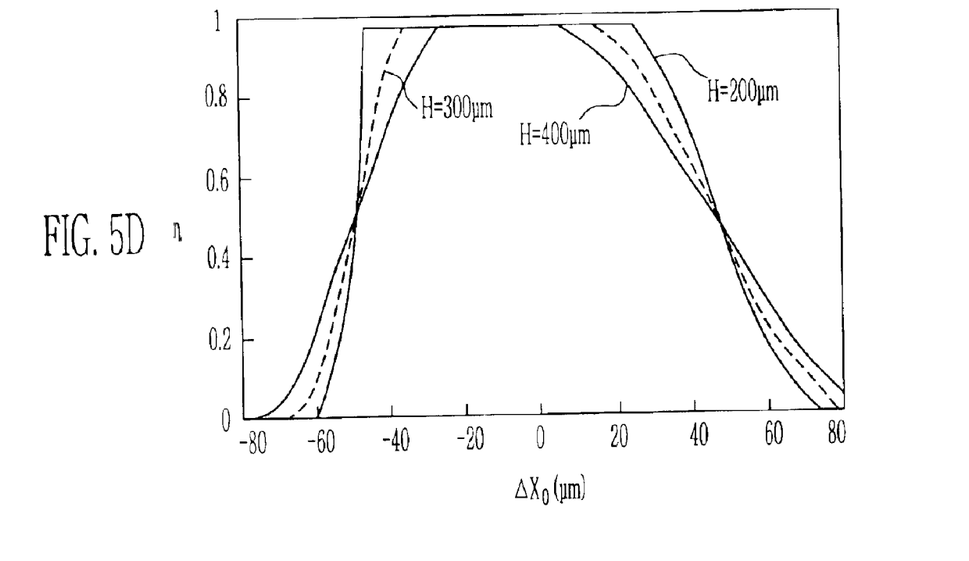

FIG. 5d is a graph illustrating a simulation result of FIG. 5a. FIG. 5d illustrates an alignment error of an X axis depending on the dimension of the optical waveguide 36, that is, variation in the height H. At this time, the distance h between the aperture of the VCSEL 34 and the optical waveguide 36 is fixed below 100 μm. If the height H is 300 μm, the mounting tolerance error of the X axis for optical coupling of 80% is ±40 μm.

Figure 6A:
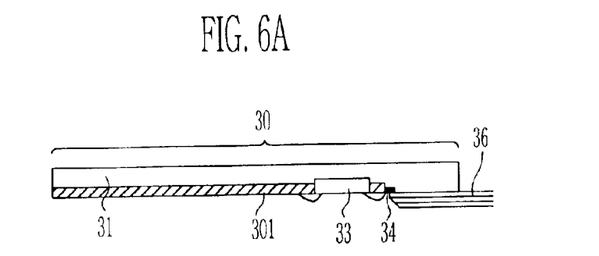
FIG. 6a~FIG. 6c show processes for describing an embodiment in which the optical transmit/receive module of the present invention is attached to a printed circuit board (PCB)
Figure 6B:
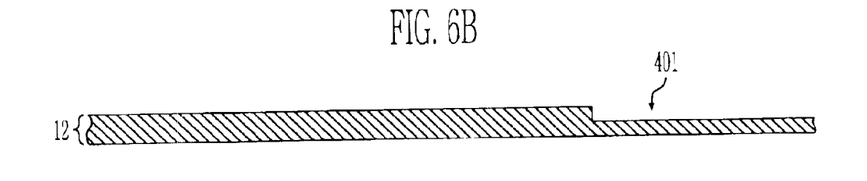
Figure 6C:
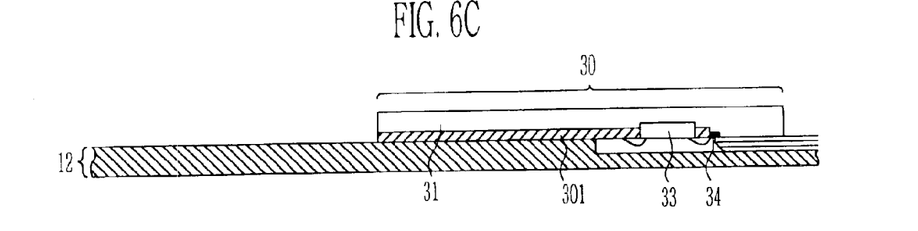

FIG. 6a~FIG. 6c illustrate processes for describing an embodiment in which the optical transmit/receive module manufactured like that described in FIG. 3f is attached to the printed circuit board (PCB).

Referring now to FIG. 6a~FIG. 6c, a given trench 401 is formed at the PCB 12 having a thickness of about 1 mm. Next, the integrated optical transmit/receive module 30 manufactured like that described in FIG. 3f is adhered to the PCB 12 using an epoxy, so that the VCSEL driver 33, the VCSEL 34 and the optical waveguide 36 are inserted into the trench 401.

Figure 7A:
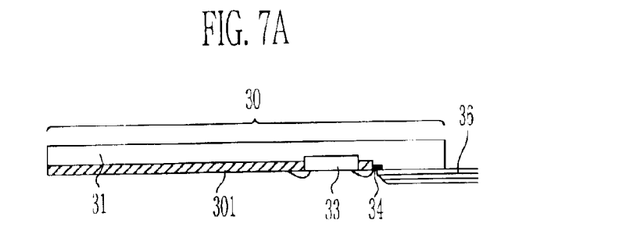
FIG. 7a~FIG. 7c show processes for describing another embodiment in which the optical transmit/receive module of the present invention is attached to the printed circuit boards (PCBs)
Figure 7B:
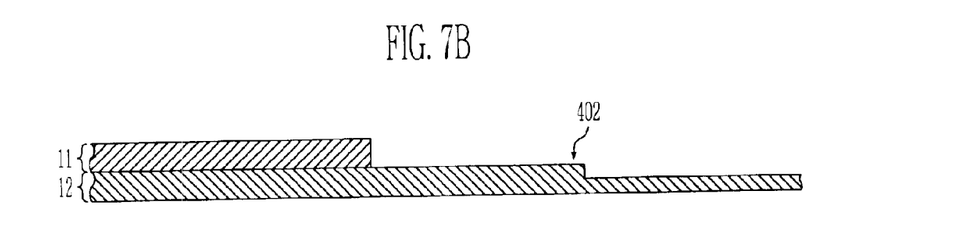
Figure 7C:
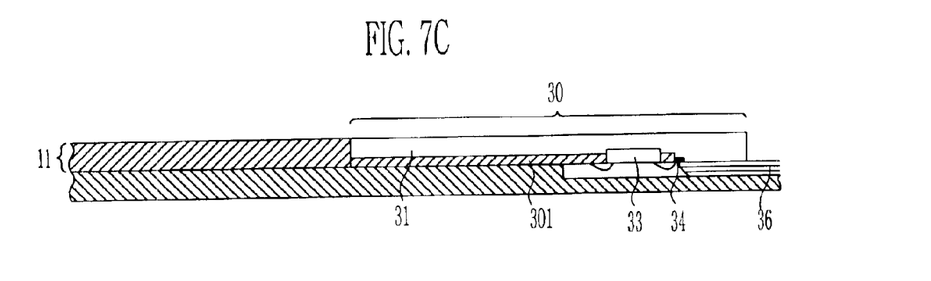

FIG. 7a~FIG. 7c illustrate processes for describing another embodiment in which the optical transmit/receive module manufactured like that described in FIG. 3f is attached to the printed circuit boards (PCBs).

Referring now to FIG. 7a~FIG. 7c, a given portion of the stacked upper and lower PCBs 11 and 12 are patterned to form a trench 402 of a step shape. The integrated optical transmit/receive module 30 manufactured like that described in FIG. 3f is adhered to the PCBs 11 and 12 using an epoxy, so that the VCSEL driver 33, the VCSEL 34 and the optical waveguide 36 are inserted into the trench 402. In the present embodiment, it should be noted that the two-layer PCBs 11 and 12 are employed and the metal bench 31 is extended to a point where the metal bench 31 and the motherboard 20 meet. It is thus possible to facilitate manufacturing the metal bench 31 and to make faster a thermal diffusion due to increased surface area.

FIG. 8a~FIG. 8d illustrate processes for describing another embodiment in which the optical transmit/receive module manufactured like that described in FIG. 3f is attached to the printed circuit boards (PCBs).

Referring now to FIG. 8a~FIG. 8d, the integrated optical transmit/receive module 30 is mounted on the PCB 12, as described by reference to FIG. 6c. The upper PCB 11 is then adhered on the PCB 12 at remaining portions except for the metal bench 30. Next, the lower circuit board 13 is attached below the PCB 12 and the via 35 is formed in the intermediate and lower PCBs 12 and 13. Thus, the high-speed board 301 and the lower PCB 13 are electrically connected.

Figure 8A:
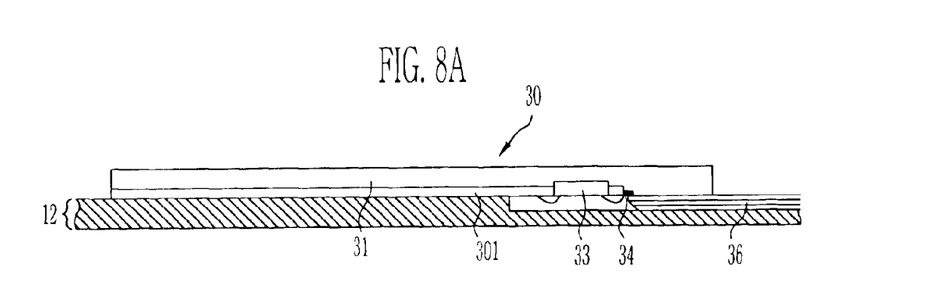
FIG. 8a~FIG. 8d show processes for describing another embodiment in which the optical transmit/receive module of the present invention is attached to the printed circuit boards (PCBs)
Figure 8B:
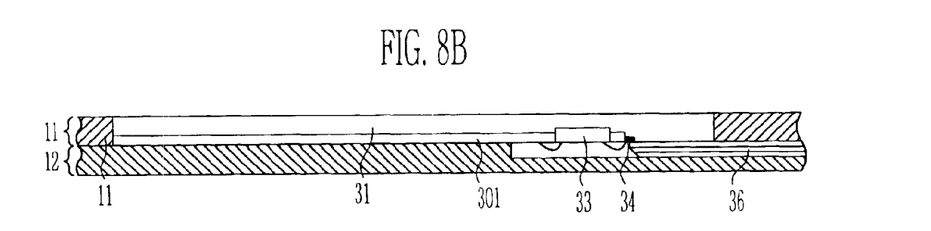
Figure 8C:
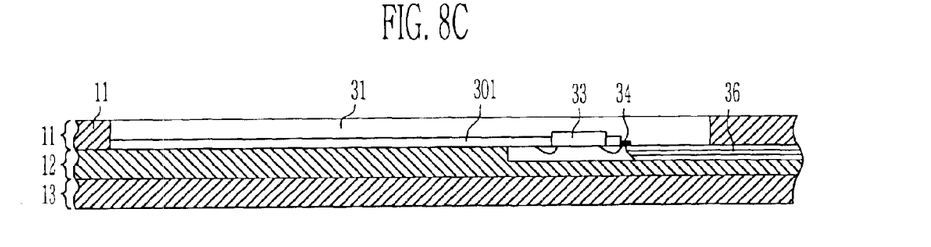
Figure 8D:
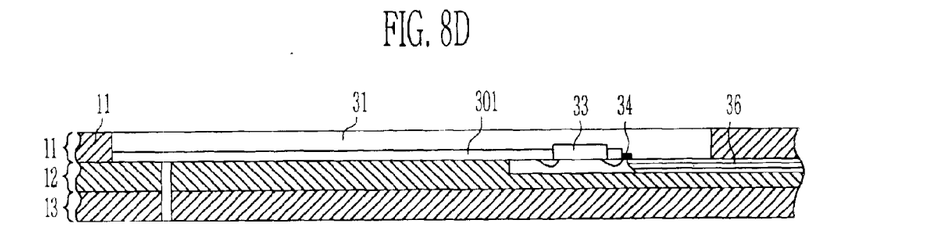
Figure 9A:
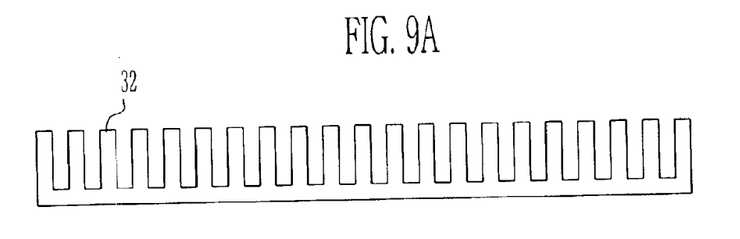
FIG. 9a~FIG. 9c show processes of attaching a heat spreader to the electro-optical circuit board (EOCB) of the present invention.
Figure 9B:
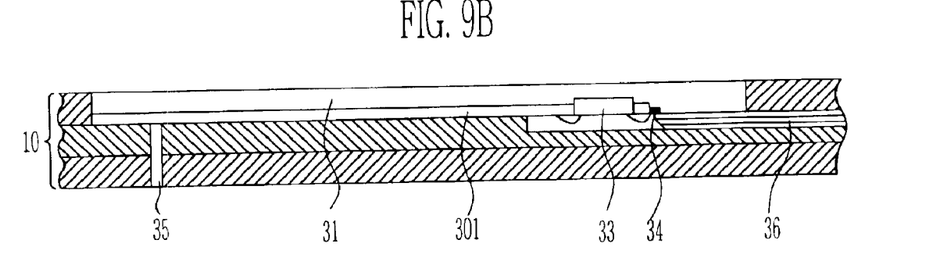
Figure 9C:
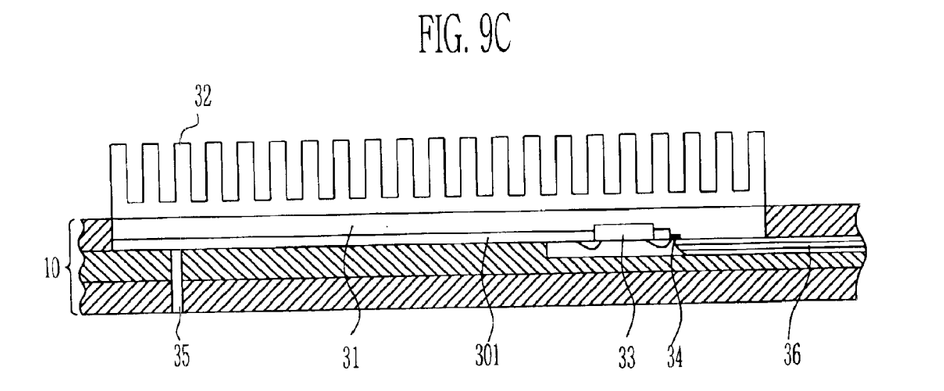

FIG. 9a~FIG. 9c show processes of attaching a heat spreader 32 through which a heat can be easily discharged toward the outside. In the electro-optical circuit board (EOCB) of the present invention, lots of heats are generated during operation since a plurality of the electrical circuit chips are mounted. Even in the worst case, a characteristic of a device may be changed by a high heat. Therefore, it is required that after the processes as in FIG. 6c, FIG. 7c or FIG. 8d are performed, the heat spreader 32 be attached on a surface of the metal bench 31 in order for a heat conducted through the metal bench 31 to be easily discharged toward the outside through the heat spreader 32.

As mentioned above, according to the present invention, an optical transmit/receive module in which an optical waveguide for transmitting an optical signal, a driving unit/receiving unit for converting an electrical signal into the optical signal, and vice versa, and an optical source/optical detector are integrated is manufactured, and the optical transmit/receive module and the circuit boards are combined to form daughter boards, so that the driving unit/receiving unit and the optical source/optical detector can be inserted into a trench formed in the circuit board. Therefore, the present invention has advantages that it can minimize an alignment error between the optical source/optical detector and the optical waveguide and facilitate its manufacture.

Further, according to the present invention, a lens for an optical coupling is not used unlike the prior art. Therefore, the present invention can reduce the cost necessary for the optical coupling and thus can reduce the manufacture cost. As a result, the present invention can improve economical efficiency and productivity. In addition, in the present invention, a metal bench and a heat spreader are employed. Due to this, an operation characteristic can be improved.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. An electro-optical circuit board, comprising:

a plurality of daughter boards having electrical circuits, on which an optical transmit/receive module and a plurality of electrical circuit chips, both of which are integrated, are mounted; and a motherboard having electrical circuits and connected to the plurality of the daughter boards, wherein an electrical signal outputted from the electrical circuit chip of one of the plurality of the daughter boards is converted into an optical signal through the optical transmit module, transmitted to an optical waveguide of the motherboard through an optical waveguide of the daughter board and then transmitted to the optical receive module through an optical waveguide of the other daughter board and wherein the optical transmit/receive module comprises:

a metal bench having a trench at its given portion;

a high-speed board attached below the metal bench except for the trench and having an electrical circuit connected to the daughter board;

a driving unit/receiving unit for converting the optical signal into an electrical signal, and vice versa, said driving unit/receiving unit being attached within the trench and electrically connected to the high-speed board by means of a bond wire;

an optical source/optical detector installed near the high-speed board and electrically connected to the driving unit/receiving unit by means of a bond wire; and an optical waveguide attached below the metal bench so that a reflecting surface is mated with an aperture of the optical source/optical detector.

2. The electro-optical circuit board as claimed in claim 1, wherein the daughter boards and the motherboard are printed circuit boards having a multi-layer structure.

3. The electro-optical circuit board as claimed in claim 1, wherein interposers for coupling with the daughter boards are included in the motherboard.

4. The electro-optical circuit board as claimed in claim 1, wherein the metal bench is made of either copper or aluminum.

5. The electro-optical circuit board as claimed in claim 1, wherein the metal bench is extended up to a point where the metal bench meets the motherboard.

6. The electro-optical circuit board as claimed in claim 1, wherein the electrical circuit of the high-speed board is connected to the electrical circuit of the daughter board through a via.

7. The electro-optical circuit board as claimed in claim 1, wherein the driving unit/receiving unit is a vertical cavity surface emitting laser.

8. The electro-optical circuit board as claimed in claim 1, wherein the optical source/optical detector is a vertical cavity surface emitting laser (VCSEL) array or a photo diode array having the total transfer amount of Gbps of several dozens or several hundreds.

9. The electro-optical circuit board as claimed in claim 1, wherein the reflecting surface of the optical waveguide has a tilt angle of 45° and is plated with a metal.

10. The electro-optical circuit board as claimed in claim 1, wherein an alignment mark is formed in the metal bench and the optical waveguide, respectively.

11. The electro-optical circuit board as claimed in claim 1, wherein the optical waveguide is attached to the metal bench by means of an UV epoxy.

12. The electro-optical circuit board as claimed in claim 1, further comprising a heat spreader attached on the metal bench.

* * * * *